US009064736B2

(12) United States Patent
Lee et al.

(10) Patent No.: US 9,064,736 B2
(45) Date of Patent: Jun. 23, 2015

(54) METHOD OF MANUFACTURING THREE DIMENSIONAL SEMICONDUCTOR MEMORY DEVICE

(71) Applicants: Joon-Suk Lee, Seoul (KR); Woong Lee, Seoul (KR); Hun-Hyeong Lim, Hwaseong-si (KR); Ki-Hyun Hwang, Seongnam-si (KR)

(72) Inventors: Joon-Suk Lee, Seoul (KR); Woong Lee, Seoul (KR); Hun-Hyeong Lim, Hwaseong-si (KR); Ki-Hyun Hwang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/248,003

(22) Filed: Apr. 8, 2014

(65) Prior Publication Data

US 2015/0104916 A1     Apr. 16, 2015

(30) Foreign Application Priority Data

Oct. 10, 2013   (KR) ........................ 10-2013-0120647

(51) Int. Cl.
*H01L 21/311*     (2006.01)
*H01L 27/115*     (2006.01)

(52) U.S. Cl.
CPC ................................ *H01L 27/11578* (2013.01)

(58) Field of Classification Search
CPC .................. H01L 21/02063; H01L 21/02252; H01L 21/02274; H01L 21/0228; H01L 21/02661; H01L 21/04; H01L 21/0415; H01L 21/046; H01L 21/30608; H01L 21/762; H01L 28/40; H01L 21/041; H01L 21/0455
USPC ......... 438/700, 270, 637, 505, 508, 513, 514, 438/506, 311, 381, 672, 733, 786, 787, 438/791; 257/E21.006, E21.007, E21.008, 257/E21.014, E21.023, E21.126, E21.127, 257/E21.135, E21.145, E21.152, E21.16, 257/E21.17, E21.247, E21.248, E21.267, 257/E21.278, E21.293, E21.311, E21.32, 257/E21.499, E21.545, E21.546, E21.561, 257/E21.564, E21.577, E21.585, E21.645
See application file for complete search history.

(56) References Cited

U.S. PATENT DOCUMENTS 7,537,980 B2   5/2009   Son et al.
7,956,408 B2   6/2011   Enda et al.
(Continued)

FOREIGN PATENT DOCUMENTS

KR   1020070116490 A   12/2007
KR   1020100034612 A    4/2010
KR   1020100133212 A   12/2010

*Primary Examiner* — David Nhu
(74) *Attorney, Agent, or Firm* — Myers Bigel Sibley & Sajovec, P.A.

(57) ABSTRACT

A method of manufacturing a three-dimensional semiconductor memory device is provided. The method includes alternately stacking a first insulation film, a first sacrificial film, alternating second insulation films and second sacrificial films, a third sacrificial film and a third insulation film on a substrate. A channel hole is formed to expose a portion of the substrate while passing through the first insulation film, the first sacrificial film, the second insulation films, the second sacrificial films, the third sacrificial film and the third insulation film. The method further includes forming a semiconductor pattern on the portion of the substrate exposed in the channel hole by epitaxial growth. Forming the semiconductor pattern includes forming a lower epitaxial film, doping an impurity into the lower epitaxial film, and forming an upper epitaxial film on the lower epitaxial film. Forming the lower epitaxial film, doping the impurity into the lower epitaxial film and forming the upper epitaxial film are all performed in-situ, and the semiconductor pattern includes a doped region and an undoped region.

20 Claims, 20 Drawing Sheets

(56) References Cited

U.S. PATENT DOCUMENTS

| | | |
|---|---|---|
| 8,278,695 B2 | 10/2012 | Kidoh et al. |
| 8,309,405 B2 | 11/2012 | Yang et al. |
| 8,350,314 B2 | 1/2013 | Fukuzumi et al. |
| 8,395,206 B2 | 3/2013 | Lee et al. |
| 8,530,959 B2 * | 9/2013 | Chang et al. .................. 257/329 |
| 8,592,873 B2 * | 11/2013 | Kim et al. .................... 257/213 |
| 8,742,488 B2 * | 6/2014 | Lee et al. ...................... 257/324 |
| 8,829,589 B2 * | 9/2014 | Lee et al. ...................... 257/316 |
| 8,901,636 B2 * | 12/2014 | Jeong ............................ 257/324 |
| 8,921,918 B2 * | 12/2014 | Shim et al. .................... 257/324 |
| 2011/0233648 A1 | 9/2011 | Seol et al. |
| 2011/0316064 A1 | 12/2011 | Kim et al. |
| 2012/0098139 A1 | 4/2012 | Chae et al. |
| 2013/0009235 A1 | 1/2013 | Yoo |

\* cited by examiner

METHOD OF MANUFACTURING THREE DIMENSIONAL SEMICONDUCTOR MEMORY DEVICE

CROSS-REFERENCE TO RELATED APPLICATION

This application claims priority under 35 U.S.C. 119 to Korean Patent Application No. 10-2013-0120647 filed on Oct. 10, 2013 in the Korean Intellectual Property Office, the disclosure of which is incorporated herein by reference in its entirety.

BACKGROUND

1. Field of the Inventive Concept

Some embodiments of the present inventive concept relate to methods of manufacturing three dimensional (3D) semiconductor memory devices. More particularly, embodiments of the present inventive concept relate to methods of manufacturing a 3D semiconductor memory device having memory cells arranged in a three dimensional manner.

2. Description of the Related Art

In order to meet increasingly stringent requirements of high performance and cost effectiveness in the field of semiconductor devices, it is desirable to increase the integration level of semiconductor devices. In particular, the integration level of a semiconductor device is an important factor in determining the cost of a product. Since the integration level of a conventional two dimensional (2D) memory device is generally determined by an area occupied by a unit memory cell, it is considerably affected by the micro patterning technology used to form the device. However, in order to achieve micro patterning, high-priced equipment is required. Accordingly, attempts to increase the integration level of the conventional 2D memory device are being made continuously. However, the results are still unsatisfactory.

To overcome the limitations of 2D device structures, 3D semiconductor memory devices including memory cells arranged in a 3D manner have been proposed. However, for mass production of 3D semiconductor memory devices, it is required to develop the technology for achieving reliable products while reducing the cost per bit.

SUMMARY

Embodiments of the present inventive concepts provide methods of manufacturing 3D semiconductor memory devices, which can simplify processing steps.

The above and other objects of the present inventive concept will be described in or be apparent from the following description of the preferred embodiments.

According to an aspect of the present inventive concept, there is provided a method of manufacturing a 3D semiconductor memory device. The method includes alternately stacking a first insulation film, a first sacrificial film, alternating second insulation films and second sacrificial films, a third sacrificial film and a third insulation film on a substrate, forming a channel hole exposing the substrate while passing through the first insulation film, the first sacrificial film, the second insulation films, the second sacrificial films, the third sacrificial film and the third insulation film, and forming a semiconductor pattern on the substrate exposed in the channel hole by epitaxial growth. Forming the semiconductor pattern includes forming a lower epitaxial film, doping impurity into the lower epitaxial film, and forming an upper epitaxial film on the lower epitaxial film. Forming the lower epitaxial film, doping of the impurity into the lower epitaxial film and forming the upper epitaxial film are performed in-situ, and the semiconductor pattern includes a doped region and an undoped region.

According to another aspect of the present inventive concepts, there is provided a method of manufacturing a three dimensional semiconductor memory device. The method includes alternately stacking a first insulation film, a first sacrificial film, alternating second insulation films and second sacrificial films, a third sacrificial film and a third insulation film on a substrate, forming a channel hole exposing the substrate while vertically passing through the first insulation film, the first sacrificial film, the second insulation films, the second sacrificial films, the third sacrificial film and the third insulation film, and in-situ doping impurity into a semiconductor pattern while forming the semiconductor pattern on the substrate exposed in the channel hole by epitaxial growth. The semiconductor pattern includes a doped region and an undoped region.

As described above, in the method of manufacturing the 3D semiconductor memory device according to the embodiment of the inventive concept, forming the semiconductor pattern electrically connecting the substrate and the vertical channel and doping the impurity into the semiconductor pattern are performed in-situ in the same equipment, thereby reducing the manufacturing cost of the 3D semiconductor memory device and simplifying processing steps of the manufacturing method of the 3D semiconductor memory device.

BRIEF DESCRIPTION OF THE DRAWINGS

The above and other features and advantages of the present inventive concept will become more apparent by describing in detail preferred embodiments thereof with reference to the attached drawings in which.

DETAILED DESCRIPTION OF THE EMBODIMENTS

Figure 1:
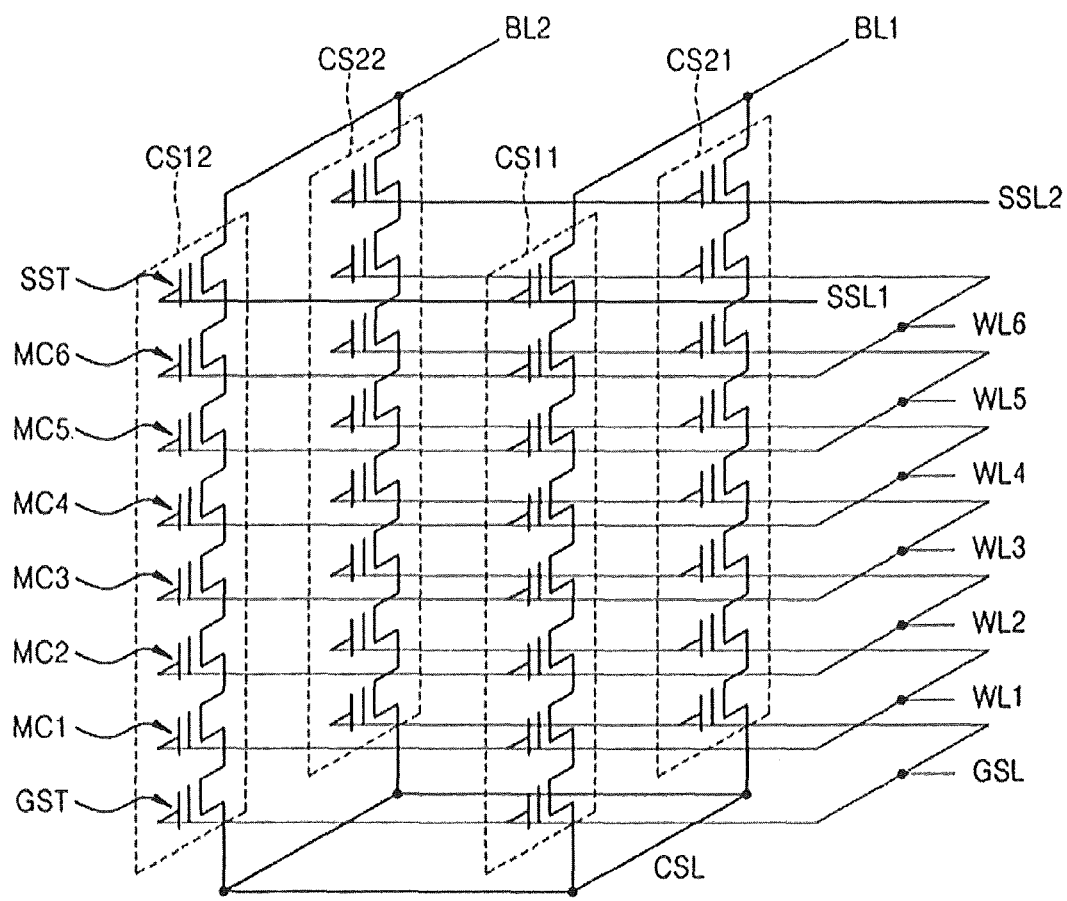
FIG. 1 is an equivalent circuit view of a memory cell array of semiconductor devices according to some embodiments of the inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a memory cell array of semiconductor devices according to some embodiments of the inventive concept will be described with reference to FIG. 1. FIG. 1 is an equivalent circuit view of a memory cell array (10) of semiconductor devices according to some embodiments of the inventive concept.

Referring to FIG. 1, the memory cell array 10 may include a plurality of cell strings CS11, CS12, CS21 and CS22 extending in a vertical direction.

Each of the cell strings CS11, CS12, CS21 and CS22 may include a ground select transistor GST, a plurality of memory cell transistors MC1, MC2, . . . , and MC6 and a string select transistor SST, which are connected to each other in series. In the embodiments illustrated in FIG. 1, each of the cell strings CS11, CS12, CS21 and CS22 includes one ground select transistor GST and one string select transistor SST. However, in some embodiments, each of the cell strings CS11, CS12, CS21 and CS22 may include two or more ground select transistors GSTs and/or two or more string select transistors SSTs, which are connected in series. In addition, the cell strings CS11, CS12, CS21 and CS22 each having 6 memory cell transistors MC1, MC2, . . . , and MC6 are illustrated, but may have 8 or more memory cell transistors MCx.

The plurality of cell strings CS11, CS12, CS21 and CS22 may be connected on a column and row basis. The string select transistor SST of each of the cell strings CS11, CS12, CS21 and CS22 may be connected to corresponding bit lines BL1, and BL2. For example, the cell strings CS11 and CS21 commonly connected to the first bit line BL1 may form a first column, and the cell strings CS12 and CS22 commonly connected to the second bit line BL2 may form a second column. In addition, the string select transistor SST of each of the cell strings CS11, CS12, CS21 and CS22 may be connected to the string select lines SSL1 and SSL2. For example, the cell strings CS11 and CS12 commonly connected to the first string select line SSL1 may form a first row, and the cell strings CS21 and CS22 commonly connected to the second string select line SSL2 may form a second row.

The ground select transistor GST of each of the cell strings CS11, CS12, CS21 and CS22 may be connected by the ground select line GSL. A common source line CSL may be connected to the ground select transistor GST of each of the cell strings CS11, CS12, CS21 and CS22.

The memory cell transistors MC1, MC2, . . . , and MC6 positioned at the same height may be connected to the same word lines WL1, WL2, . . . , and WL6, respectively. For example, the first memory cell transistor MC1 connected to the ground select transistor GST may be connected to the first memory cell transistor MC1 of a column adjacent thereto through the first word line WL1.

Figure 2:
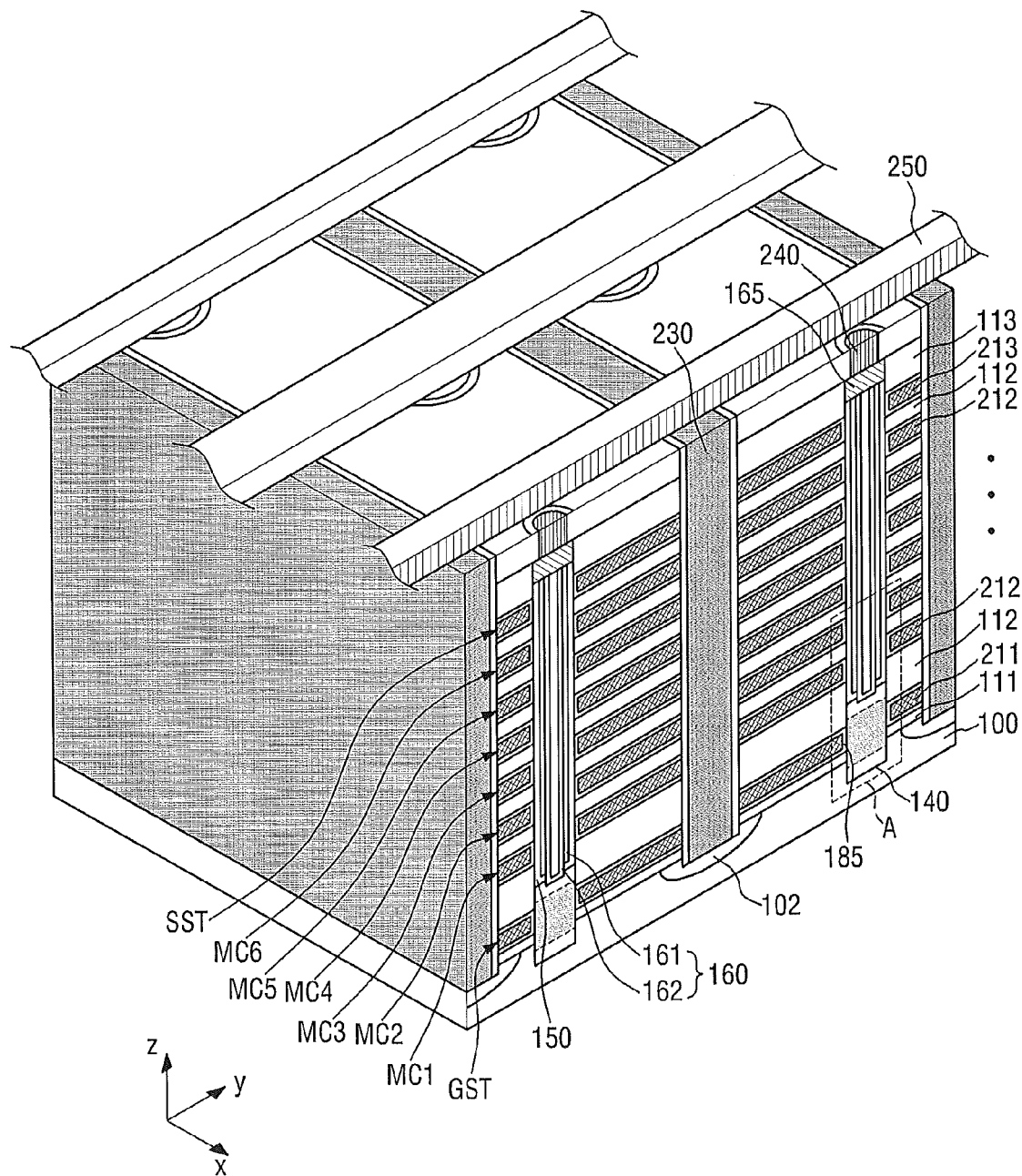
FIG. 2 is a perspective view of a semiconductor device according to an embodiment of the inventive concept.

FIG. 2 is a perspective view of a semiconductor device (1000) according to an embodiment of the inventive concept.

Referring to FIG. 2, the semiconductor device 1000 according to an embodiment of the inventive concept may include lower, intermediate and upper insulation films 111, 112 and 113 alternately stacked on a substrate 100, ground, cell and string select gate electrodes 211, 212 and 213, a vertical channel 160 and a semiconductor pattern 140.

The substrate 100 may include a silicon substrate, a germanium substrate, a silicon-germanium substrate, a silicon on insulator (SOI) substrate, and so on.

A plurality of impurity regions 102 extending in a first direction X and spaced apart from each other in a second direction Y perpendicular to the first direction X may be provided in a substrate 100. Cylindrical vertical channels 160 extending in a third direction Z perpendicular to the first direction X and the second direction Y may be formed on the substrate 100 between adjacent impurity regions 102. The vertical channels 160 may include silicon. A filling insulation film 163 (see FIG. 3H) may be formed in the vertical channels 160. The filling insulation film 163 may include an insulating material, such as silicon oxide, silicon oxynitride or silicon nitride. A charge storage film 150 may be formed on outer walls of the vertical channels 160. The charge storage film 150 will be described in detail below with reference to FIG. 4. A channel pad 165 may be formed on the vertical channels 160, the filling insulation film 163 and the charge storage film 150. The channel pad 165 may include silicon doped with impurity, such as boron (B).

A semiconductor pattern 140 in the shape of a pillar may be formed between the vertical channels 160 and the substrate 100. A top surface of the semiconductor pattern 140 may come into contact with bottoms of the vertical channels 160, and a bottom surface of the semiconductor pattern 140 may come into contact with the substrate 100, thereby electrically connecting the vertical channels 160 to the substrate 100. The semiconductor pattern 140 may include silicon. The semiconductor pattern 140 may cover lateral surfaces of one or more ground select gate electrodes 211. The top surface of the semiconductor pattern 140 may be positioned between the ground select gate electrodes 211 and the bottommost cell gate electrode 212. The semiconductor pattern 140 includes a doped region 145 containing impurity and an undoped region 146 not doped with impurity. The doped region 145 may be formed on lateral surfaces of the ground select gate electrodes 211 and the semiconductor pattern 140. The undoped region 146 may be formed at contact portions between each of the charge storage film 150 and the vertical channels 160 and the semiconductor pattern 140.

The ground select gate electrodes 211 may surround outer walls of the semiconductor pattern 140. A horizontal insulation film 185 may be interposed between the ground select gate electrodes 211 and the semiconductor pattern 140. The ground select gate electrodes 211 may include a conductive material, such as tungsten, copper or metal silicide. The ground select gate electrodes 211 may serve as the ground select line (GSL of FIG. 1).

The plurality of cell gate electrodes 212 may be formed along the outer walls of the vertical channels 160 and the charge storage film 150 on the ground select gate electrodes 211 to be spaced apart from each other in the third direction Z. The plurality of cell gate electrodes 212 may include a conductive material, such as tungsten, copper or metal silicide. The plurality of cell gate electrodes 212 may serve as the word lines (WL1, WL2, . . . , and WL6 of FIG. 1).

The string select gate electrode 213 may be formed along the outer walls of the vertical channels 160 and the charge storage film 150 on the plurality of cell gate electrodes 212 to be spaced apart from each other in the third direction Z. The string select gate electrode 213 may include a conductive material, such as tungsten, copper or metal silicide. The string select gate electrode 213 may serve as the string select lines (SSL1 and SSL2 of FIG. 1).

A lower insulation film 111 may be interposed between the ground select gate electrodes 211 and the substrate 100, and an intermediate insulation film 112 may be interposed between the ground select gate electrodes 211 and the plurality of cell gate electrodes 212. An upper insulation film 113 may be formed on the string select gate electrode 213. The lower, intermediate and upper insulation films 111, 112 and 113 may include an insulating material, such as silicon oxide, silicon oxynitride or silicon nitride.

A common source line 230 may be formed on each of the impurity regions 102 to extend in the first direction X. An insulation spacer 220 (see FIG. 3L) is formed on opposite sidewalls of the common source line 230 and electrically insulates the ground select gate electrodes 211, the cell gate electrodes 212 and the string select gate electrode 213 from the common source line 230.

A bit line contact plug 240 is formed on the channel pad 165, and a bit line 250 extending in the second direction Y is formed on the bit line contact plug 240.

Referring again to FIGS. 1 and 2, a portion of the horizontal insulation film 185 and the ground select gate electrodes 211, which are adjacent to the semiconductor pattern 140, a portion of the charge storage film 150 and the cell gate electrodes 212, which are adjacent to the vertical channels 160, and the string select gate electrode 213 may form with the cell strings CS11, CS12, CS21 and C22. For example, the semiconductor pattern 140, the ground select gate electrodes 211 and the horizontal insulation film 185 interposed therebetween may function as the ground select transistor GST. The vertical channels 160, the plurality of cell gate electrodes 212 and the charge storage film 150 interposed therebetween may function as the memory cell transistors MC1, MC2, . . . , and MC6. The vertical channels 160, the string select gate electrode 213 and the charge storage film 150 interposed therebetween may function as the string select transistor SST.

The memory cell arrays 10 shown in FIGS. 1 and 2 are provided only for illustration, but the number of word lines WLx, the number of string select lines SSLx, and the number of ground select lines GSLx are not limited to those illustrated herein. For example, two or more string select lines SSLx may be sequentially formed in the second direction Y, or two or more ground select lines GSLx may be sequentially formed in the second direction Y. In addition, various numbers, for example, 8, 16, 32, etc. of word lines WLx may be formed. Further, the number of cell strings CSxy connected to the bit line BL is not limited to that shown in FIGS. 1 and 2, but various numbers of cell strings CSxy may be formed according to the design of memory cell array 10.

Figure 3A:
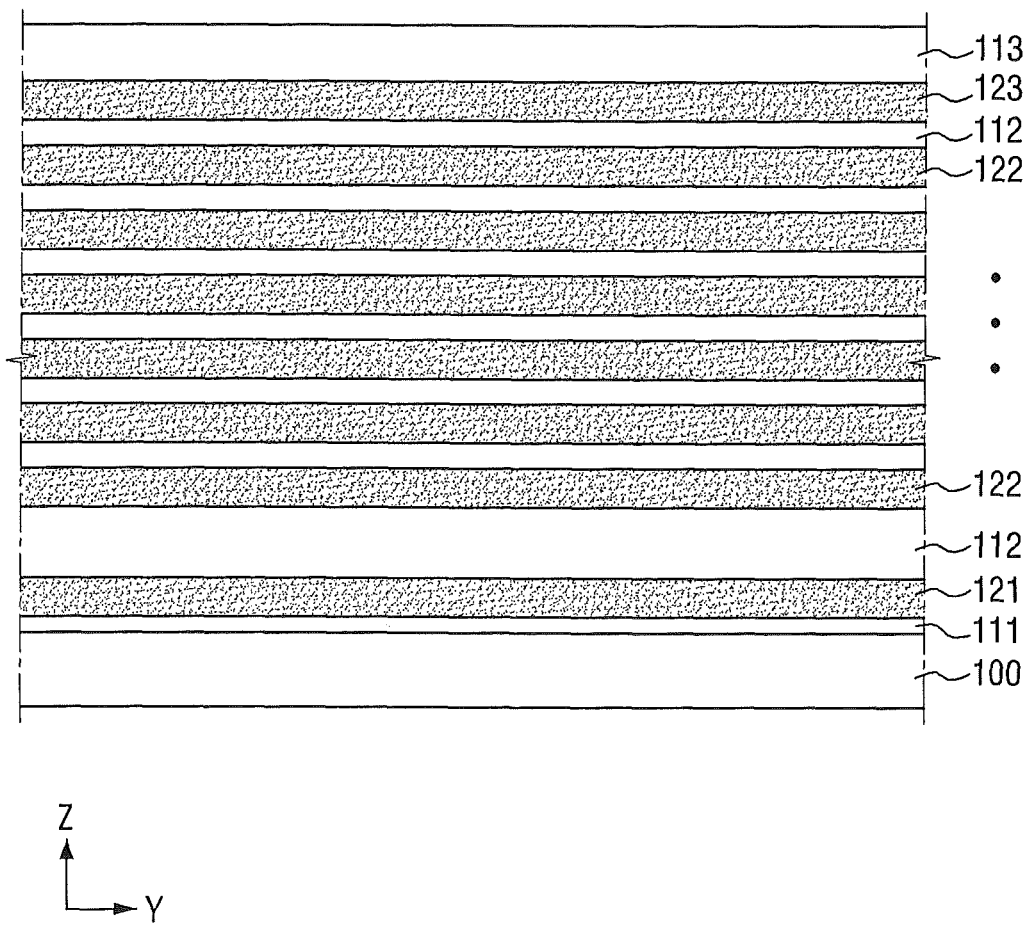
FIGS. 3A through 3M are cross-sectional views vertically taken a perspective view of FIG. 2 along a first direction X, and illustrate intermediate process steps of a method of manufacturing a 3D semiconductor device according to an embodiment of the inventive concept.
Figure 3B:
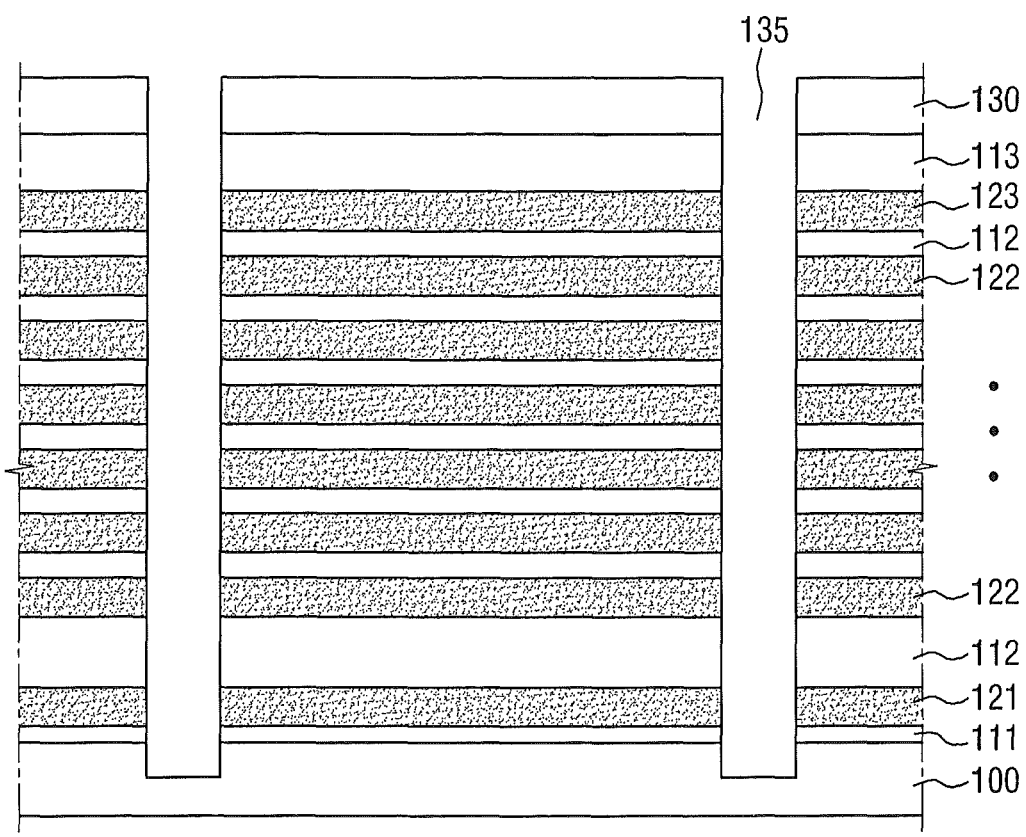
Figure 3C:
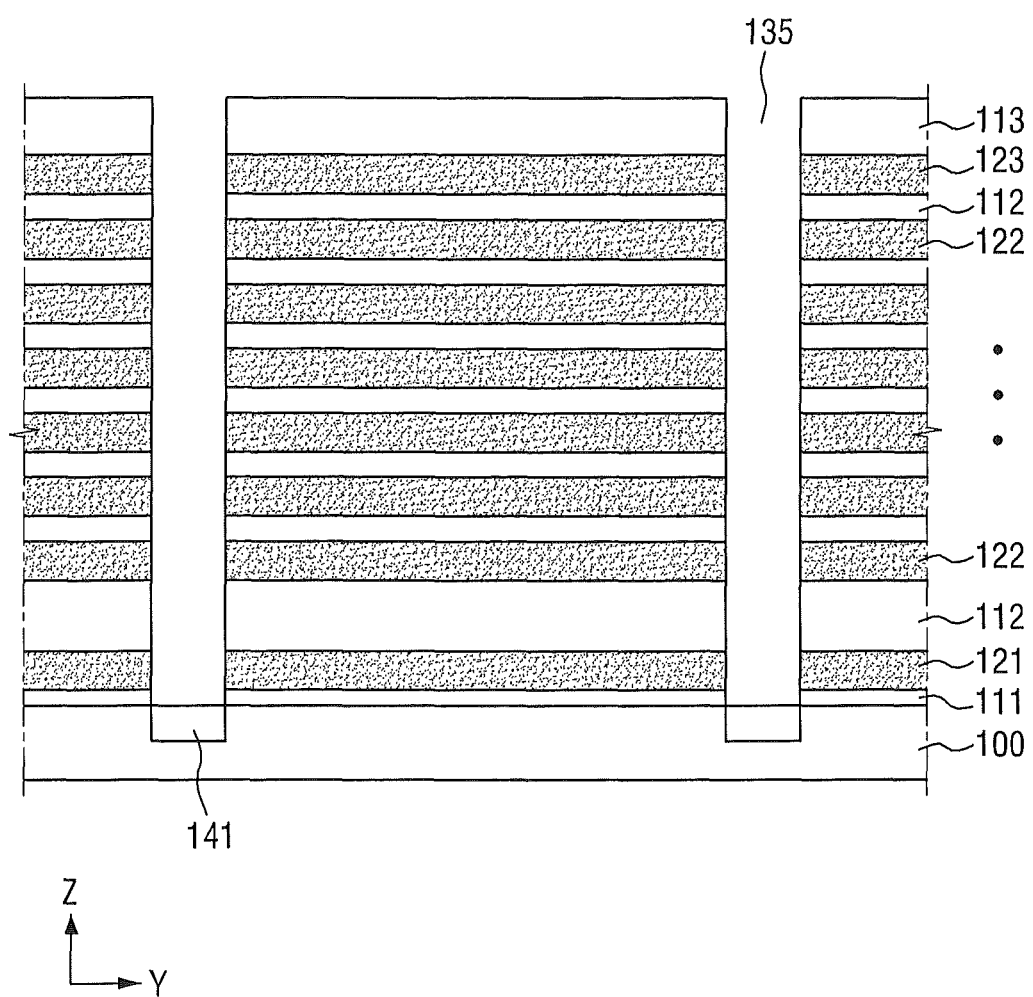
Figure 3D:
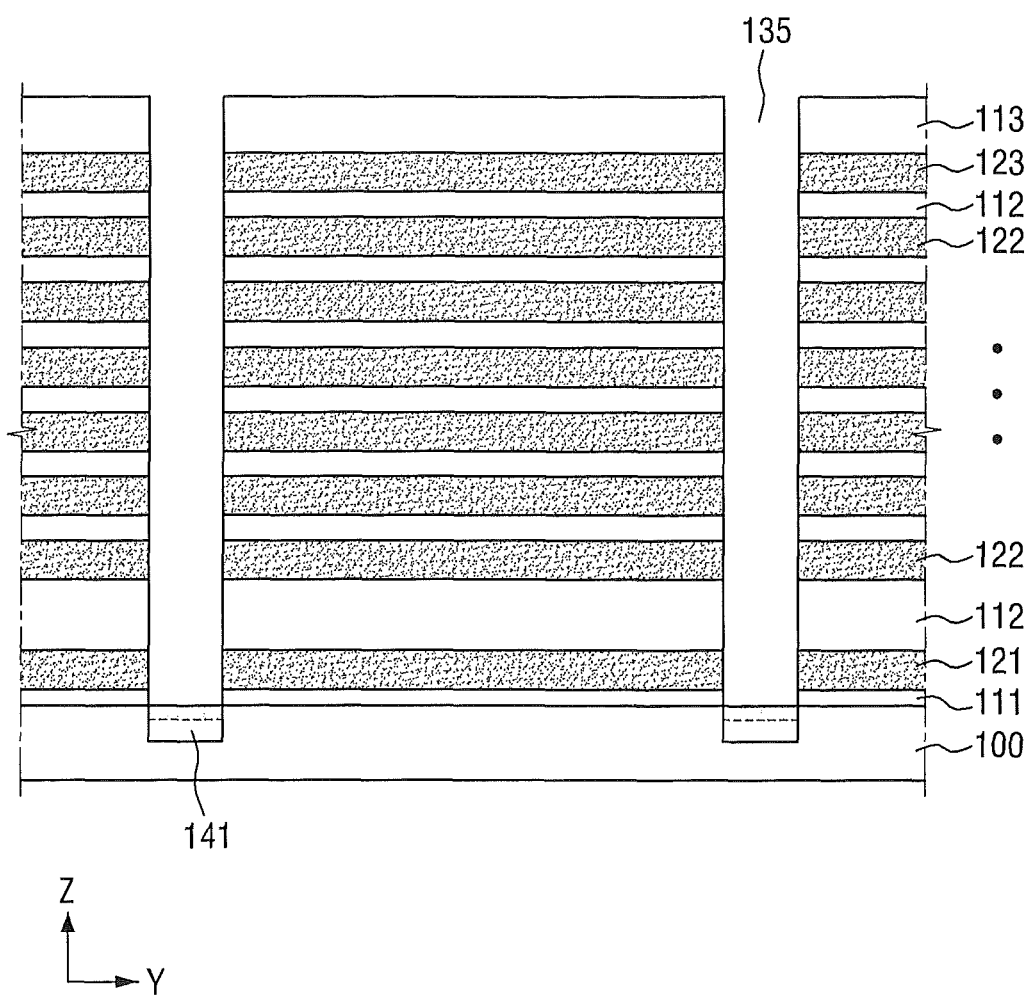
Figure 3E:
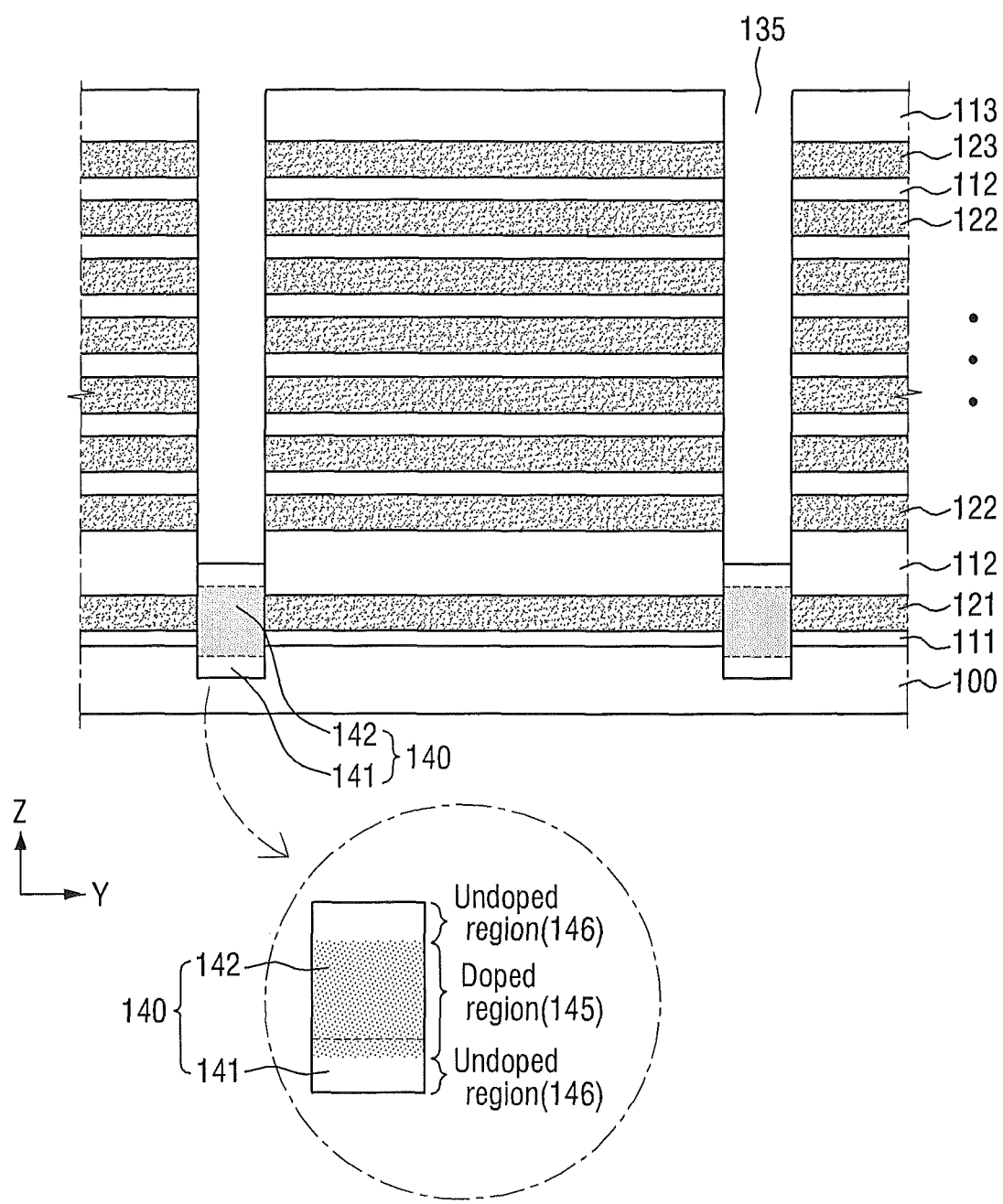

In the 3D semiconductor memory device, the semiconductor pattern 140 electrically connecting the substrate 100 to the vertical channels 160 may have a doped region 145 and an undoped region 146 (see FIG. 3E). A threshold voltage of the ground select transistor 211 may be adjusted according to an impurity concentration of the doped region 145. In addition, the undoped region 146 may be positioned between the vertical channels 160 and the doped region 145, thereby obstructing impurities from moving into the vertical channels 160.

Figure 6:
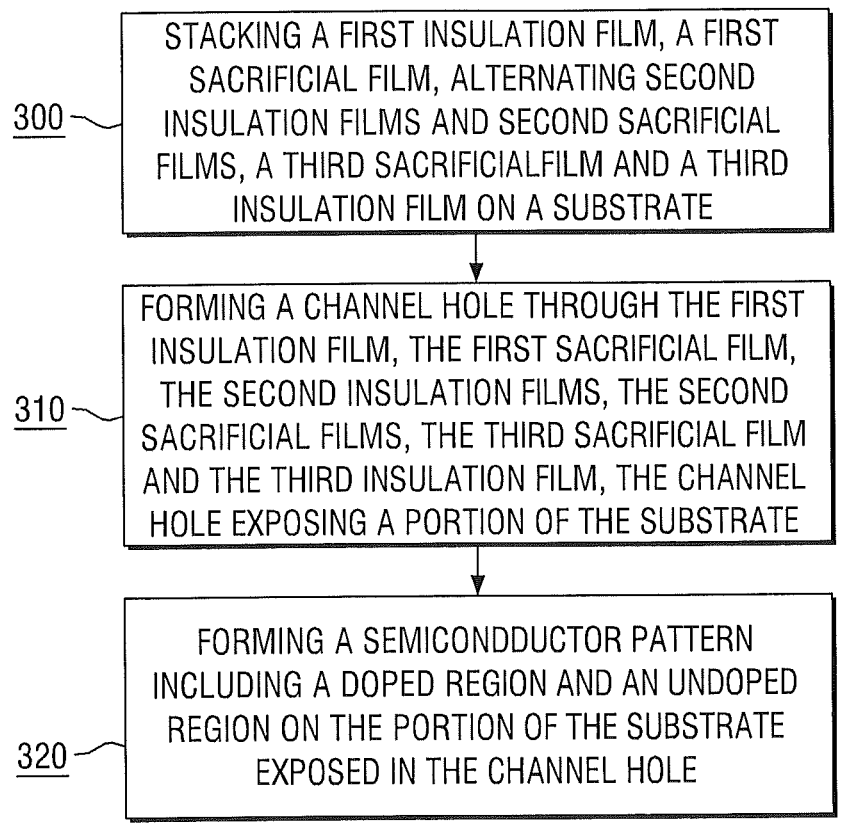
FIG. 6 is a flowchart illustrating operations according to some embodiments.

FIG. 6 is a flowchart illustrating operations according to some embodiments. Referring to FIG. 6, the operations include stacking a first insulation film, a first sacrificial film, alternating second insulation films and second sacrificial films, a third sacrificial film and a third insulation film on a substrate (block 300). A channel hole is formed to expose a portion of the substrate (block 310). The channel hole passes through the first insulation film, the first sacrificial film, the second insulation films, the second sacrificial films, the third sacrificial film and the third insulation film, the channel hole to expose the portion of the substrate. A semiconductor pattern is formed on the portion of the substrate exposed in the channel hole (block 320). The semiconductor pattern may be formed by selective epitaxial growth, and may be formed by forming a lower epitaxial film on the substrate, doping an impurity into the lower epitaxial film, and forming an upper epitaxial film on the lower epitaxial film. Forming the upper and lower epitaxial films and doping the lower epitaxial film may be performed in-situ. Moreover, the semiconductor pattern may include a doped region and an undoped region. In particular, the semiconductor pattern may include a first undoped region on the substrate, a doped region on the first undoped region, and a second undoped region on the doped region opposite the first undoped region.

FIGS. 3A through 3M are cross-sectional views vertically taken a perspective view of FIG. 2 along a first direction X, and illustrate intermediate process steps of a method of manufacturing a 3D semiconductor device according to an embodiment of the inventive concept.

First, referring to FIG. 3A, a lower insulation film 111 is formed on a substrate 100, a lower sacrificial film 121 is formed on the lower insulation film 111, and a plurality of intermediate insulation films 112 and a plurality of intermediate sacrificial films 122 are alternately stacked on the lower sacrificial film 121. The number of the intermediate sacrificial films 122 may vary according to the number of memory cell transistors to be formed. In addition, an upper sacrificial film 123 is formed on the topmost intermediate insulation film 112, and an upper insulation film 113 is formed on the upper sacrificial film 123.

The lower, intermediate and upper insulation films 111, 112 and 113 may include an insulating material, such as silicon oxide, silicon oxynitride or silicon nitride. The lower, intermediate and upper insulation films 111, 112 and 113 may have different thicknesses. The thickness of the lower insulation film 111 may be smaller than the thicknesses of the intermediate insulation films 112. The thickness of the bottommost intermediate insulation film 112 may be greater than the thicknesses of the other intermediate insulation films 112.

The intermediate sacrificial films 122 may have the same thickness. The lower and upper sacrificial films 121 and 123 may have thicknesses different from the thicknesses of the intermediate sacrificial films 122. For example, the lower and upper sacrificial films 121 and 123 defined as potential regions where a ground select line GSL and a string select line SSL are to be formed may be thicker than the other sacrificial films.

Next, referring to FIG. 3B, channel holes 135 are formed, the channel holes 135 exposing the substrate 100 while passing through the lower, intermediate and upper insulation films 111, 112 and 113. For example, the forming of the channel holes 135 may include forming a mask pattern 130 on the upper insulation film 113 and sequentially anisotropically etching the upper insulation film 113, the upper sacrificial film 123, the intermediate insulation films 112, the intermediate sacrificial film 122, the lower sacrificial film 121 and the lower insulation film 111 using the mask pattern 130 as an etch mask until a top surface of the substrate 100 is exposed. Through the anisotropically etching, the surface of the substrate 100 in the channel hole 135 may be overetched to be recessed to a predetermined depth. The channel holes 135 may be in forms of holes.

Referring to FIG. 3B together with FIG. 2, the channel holes 135 may be formed in a zigzag configuration in the first direction X. The mask pattern 130 may include photoresist. The mask pattern 130 may later be removed.

Referring to FIG. 3C, a lower epitaxial film 141 filling the recessed substrate 100 in the channel holes 135 is formed. The lower epitaxial film 141 may be formed by performing a selective epitaxial growth (SEG) process using the substrate 100 exposed in the channel hole 135. The SEG process may include chemical vapor deposition using a silicon source gas. A thickness of the lower epitaxial film 141 maybe about equal to the predetermined depth by which the channel hole was overetched into the substrate. Thus, a top surface of the lower epitaxial film 141 may be positioned at a boundary surface between the substrate 100 and the lower insulation film 111.

Referring to FIG. 3D, impurity is doped into the lower epitaxial film 141 to a predetermined depth. The forming of the lower epitaxial film 141 and the doping of the impurity may be performed in-situ (i.e., in the same processing equipment). The doping of the impurity may include gas phase doping (GPD) using an impurity-containing source gas.

Referring to FIG. 3E, an upper epitaxial film 142 having a predetermined region doped with impurity is formed on the lower epitaxial film 141. The lower epitaxial film 141 and the 1 upper epitaxial film 142 are formed in-situ in the same processing equipment. In addition, the forming of the upper epitaxial film 142 and the doping of the impurity may be simultaneously performed. For example, a source gas used to form the upper epitaxial film 142 a source gas used to dope the impurity may be simultaneously supplied to the same processing equipment. Accordingly, the upper epitaxial film 142 may grow at the same time with the doping of the impurity.

The upper epitaxial film 142 may be formed by performing an SEG process using the lower epitaxial film 141 as a seed. The impurity may be doped into the upper epitaxial film 142 by GPD.

Accordingly, a semiconductor pattern 140 including the lower epitaxial film 141 and the upper epitaxial film 142 may be formed. The semiconductor pattern 140 may be shaped of a pillar formed to a predetermined height from a bottom of the channel hole 135. The semiconductor pattern 140 may make direct contact with sidewalls of the sacrificial films and the insulation films positioned at lower portions of the channel holes 135. The semiconductor pattern 140 may cover sidewalls of one or more sacrificial films. In addition, a top surface of the semiconductor pattern 140 may be positioned between the sacrificial films that are vertically adjacent to each other. The semiconductor pattern 140 may have a doped region 145 that is doped with an impurity and undoped regions 146 that are not doped with an impurity. The undoped regions 146 may be formed at top and bottom portions of the semiconductor pattern 140, and the doped region 145 may be formed between the undoped regions 146. The doped region 145 may overlap with a lateral surface of the lower sacrificial film 121.

Figure 3F:
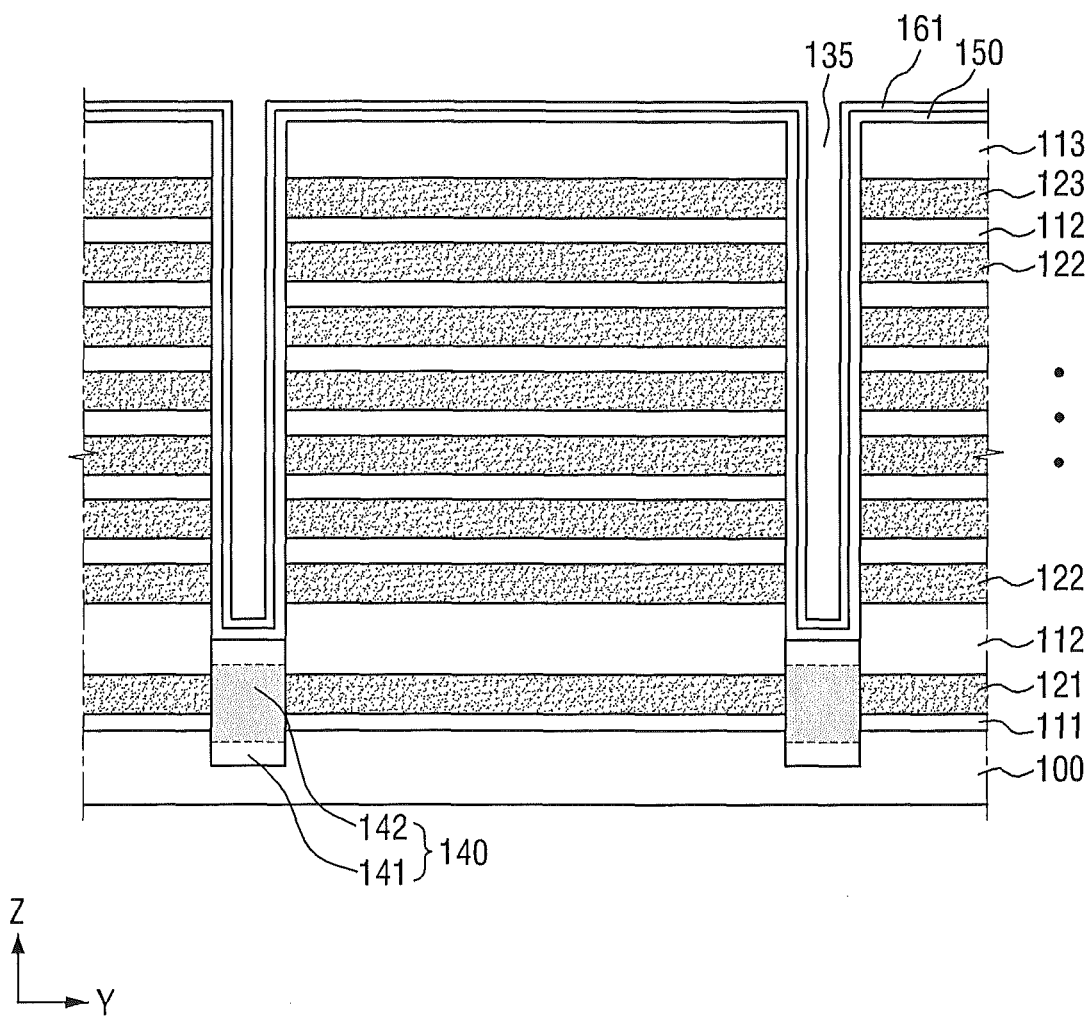

Referring to FIG. 3F, a charge storage film 150 and a first semiconductor film 161 are sequentially formed on the upper insulation film 113, sidewalls of the channel hole 135 and the semiconductor pattern 140 exposed in the channel hole 135. The charge storage film 150 may include a plurality of thin films. The charge storage film 150 will be described in detail herein with reference to FIG. 4.

Figure 3G:
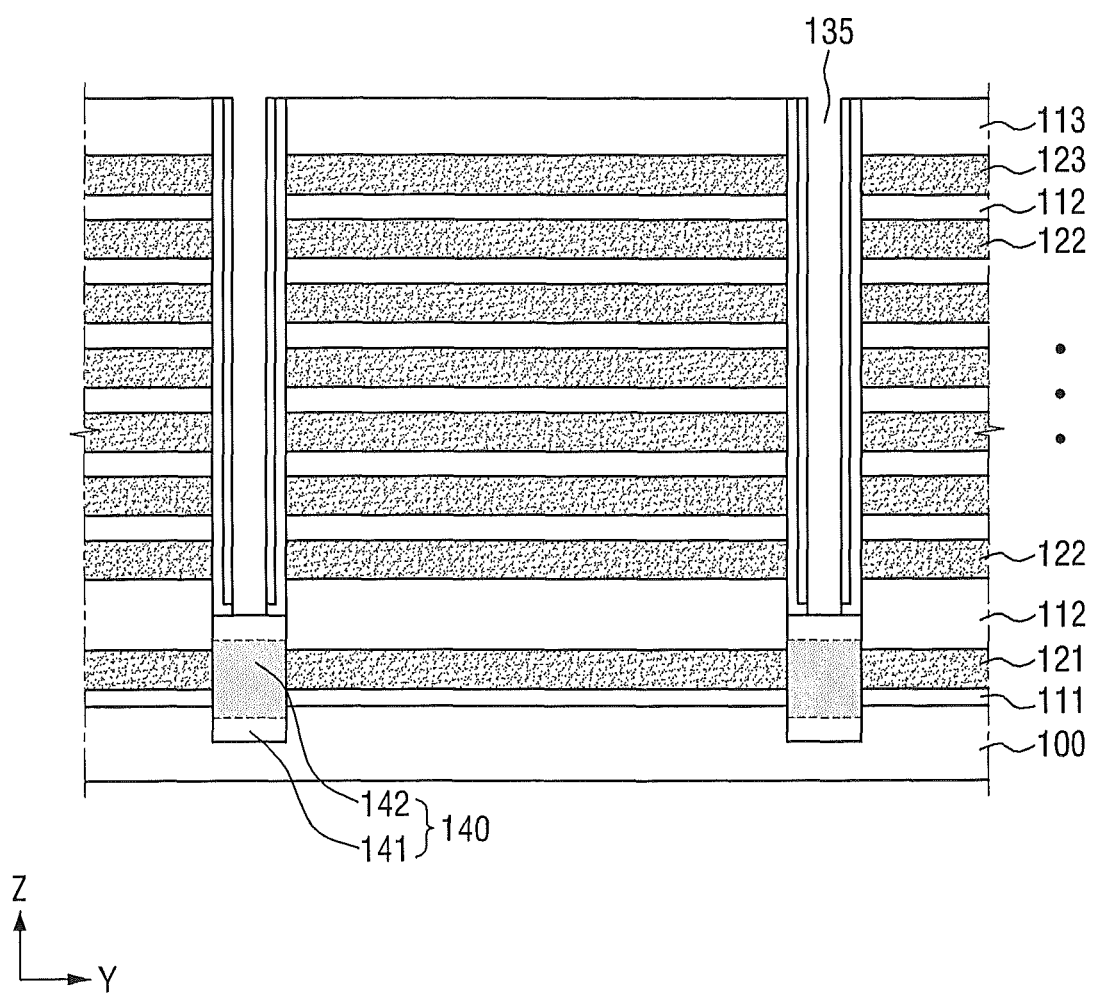

Referring to FIG. 3G, the charge storage film 150 and the first semiconductor film 161 formed on the upper insulation film 113 and the semiconductor pattern 140 are removed using, for example, an isotropic etching process. Accordingly, the charge storage film 150 and the first semiconductor film 161 are formed as spacers on the sidewalls of the channel hole 135, and a portion of the semiconductor pattern 140 may be exposed.

Figure 3H:
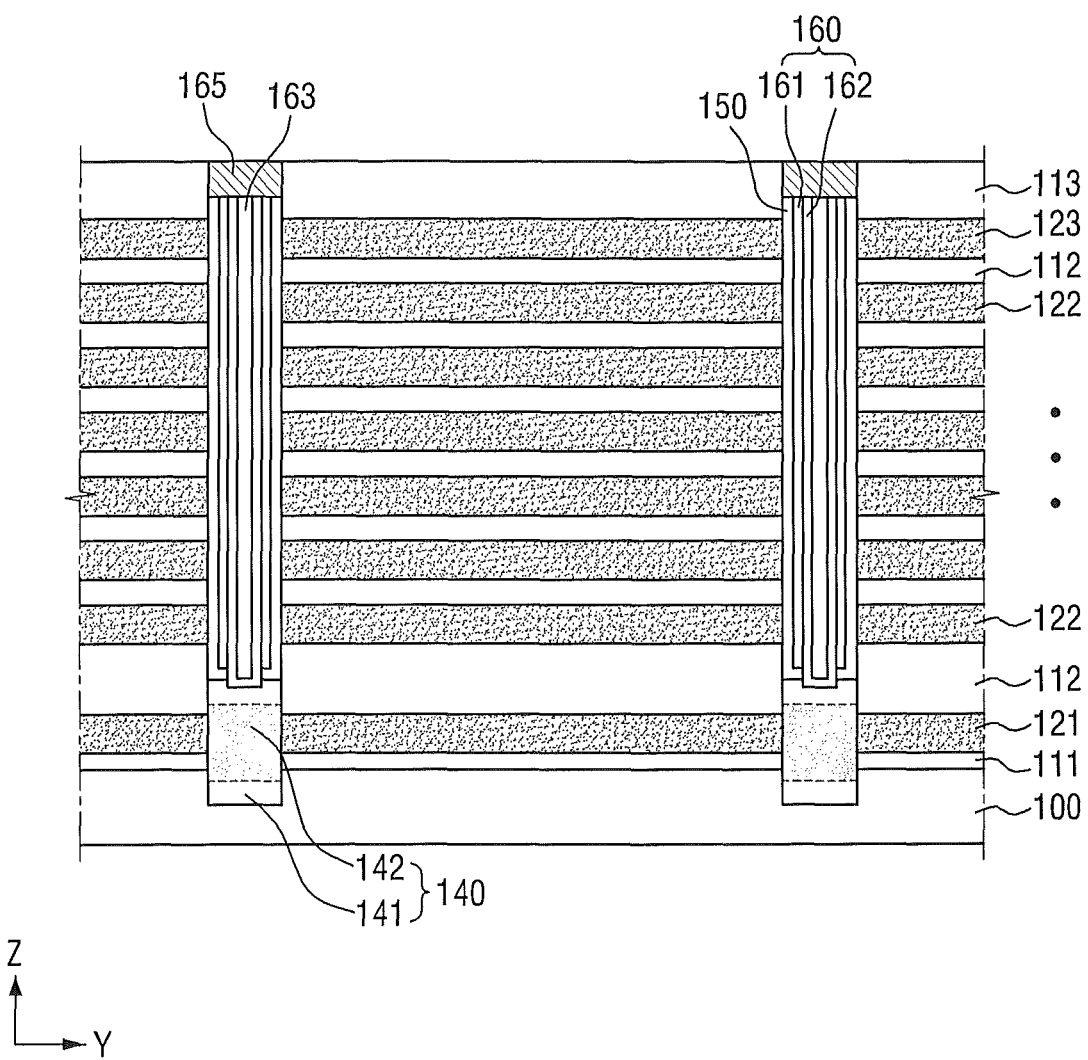

Referring to FIG. 3H, a second semiconductor film 162 is formed on the first semiconductor film 161 and the semiconductor pattern 140 exposed in the channel hole 135. As a result, a structure having the charge storage film 150 and the vertical channel 160 sequentially stacked on the sidewalls of the channel hole 135 may be formed. The vertical channel 160 may include the first semiconductor film 161 and the second semiconductor film 162. The vertical channel 160 may come into contact with a top surface of the semiconductor pattern 140. The vertical channel 160 may include polysilicon. In addition, a filling insulation film 163 is formed on the vertical channel 160 in the channel hole 135, and a channel pad 165 filling a top portion of the channel hole 135 may be formed on the sidewalls of the channel hole 135, the charge storage film 150, the vertical channel 160 and the filling insulation film 163. For example, the forming of the channel pad 165 may include blanket forming a conductive material on the sidewalls of the channel hole 135, the charge storage film 150, the vertical channel 160, the filling insulation film 163 and the upper insulation film 113, and planarizing the conductive material so as to expose a top surface of the upper insulation film 113. The channel pad 165 may include a conductive material, such as doped polysilicon.

Figure 3I:
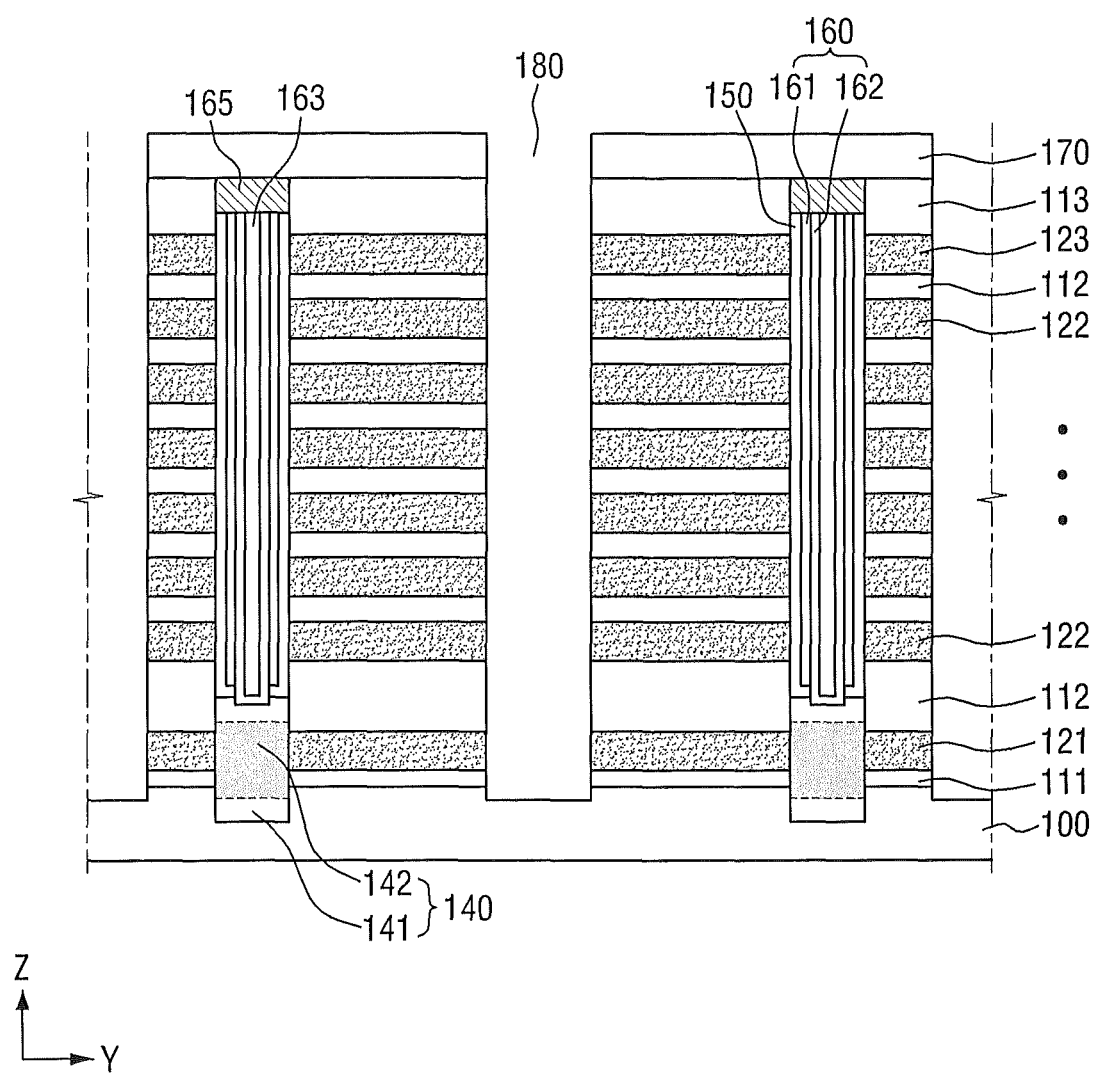

Referring to FIG. 3I, a trench 180 exposing the substrate 100 is formed by anisotropically etching the lower insulation film 111 between adjacent vertical channels 160, the intermediate insulation films 112, the upper insulation film 113, the first interlayer insulation film 170, the lower sacrificial film 121, the intermediate sacrificial films 122 and the upper sacrificial film 123. The trench 180 may be formed to vertically pass through the lower insulation film 111, the intermediate insulation films 112, the upper insulation film 113, the first interlayer insulation film 170, the lower sacrificial film 121, the intermediate sacrificial films 122 and the upper sacrificial film 123 and may extend in the first direction X. Lateral surfaces of the lower insulation film 111, the intermediate insulation films 112, the upper insulation film 113, the first interlayer insulation film 170, the lower sacrificial film 121, the intermediate sacrificial films 122 and the upper sacrificial film 123 may be exposed in the trench 180.

Figure 3J:
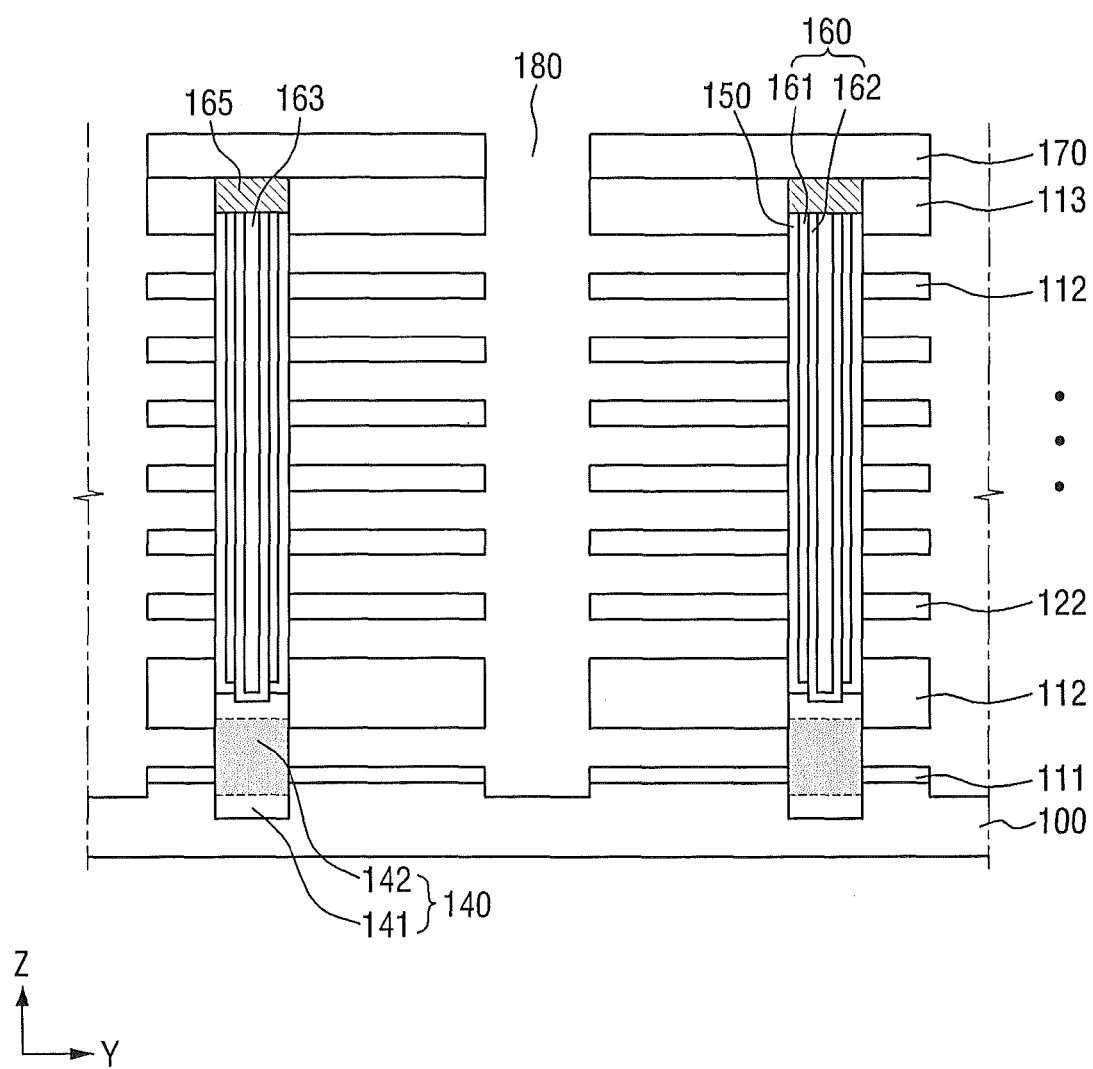

Referring to FIG. 3J, the lower sacrificial film 121, the intermediate sacrificial films 122 and the upper sacrificial film 123, which are exposed to the sidewalls of the trench 180, are removed. As a result, the charge storage film 150 and the semiconductor pattern 140 may be exposed to regions from which the lower sacrificial film 121, the intermediate sacrificial films 122 and the upper sacrificial film 123 are removed. If the lower sacrificial film 121, the intermediate sacrificial films 122 and the upper sacrificial film 123 include silicon nitride or silicon oxynitride, the removing of the lower sacrificial film 121, the intermediate sacrificial films 122 and the upper sacrificial film 123 may be performed, for example, using an etching solution containing phosphoric acid.

Figure 3K:
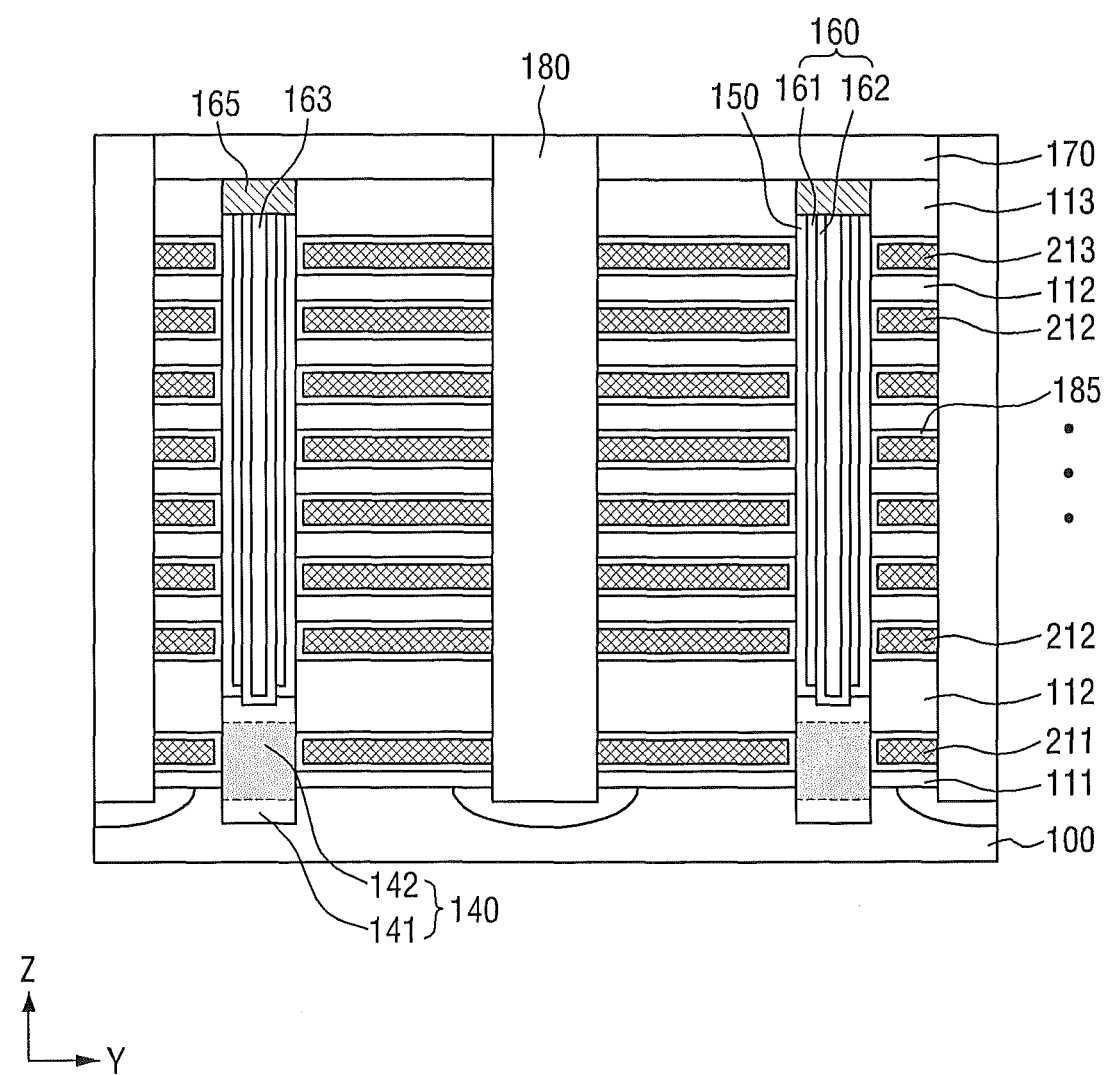

Referring to FIG. 3K, a horizontal insulation film 185 and a conductive material are sequentially formed in the regions from which the lower sacrificial film 121, the intermediate sacrificial films 122 and the upper sacrificial film 123 are removed, thereby forming a ground select gate 211, cell gate electrodes 212 and a string select gate 213. The ground select gate 211, the cell gate electrodes 212 and the string select gate 213 may include a metal, metal silicide, or a combination thereof. For example, the ground select gate 211, the cell gate electrodes 212 and the string select gate 213 may include tungsten, aluminum, copper or metal silicide.

Thereafter, heavily doped impurity ions are supplied to the substrate 100 exposed in the trench 180, thereby forming an impurity region 102. For example, n type impurities, such as phosphorus (P) or arsenic (As) ions, may be implanted into the substrate 100 on a bottom portion of the trench 180.

Figure 3L:
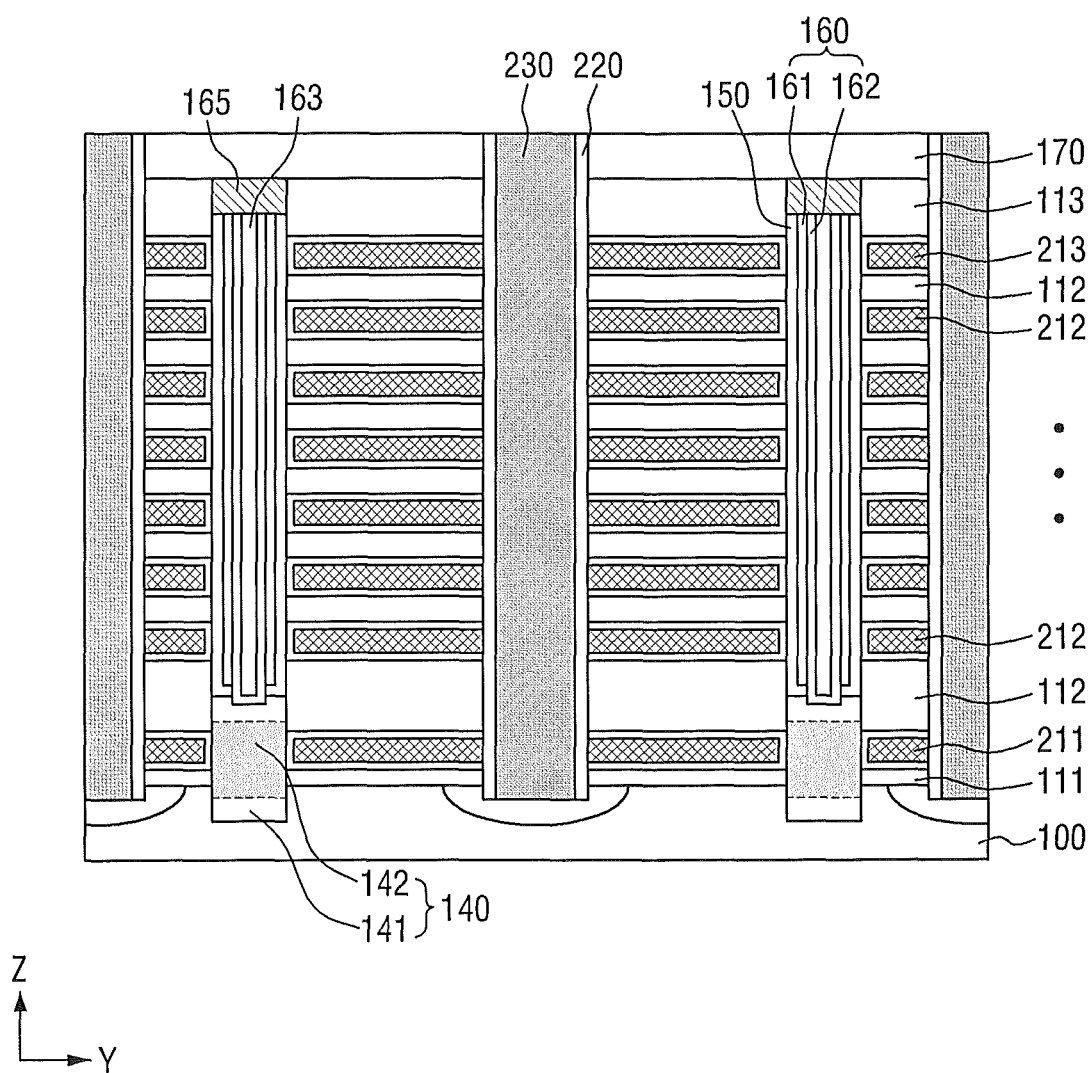

Referring to FIG. 3L, an insulation spacer 220 is formed on inner walls of the trench 180. For example, an insulating material is formed on the sidewalls of the trench 180, the substrate 100 exposed to the bottom of the trench 180 and the first interlayer insulation film 170, and an isotropic etching process is performed to expose the top surface of the substrate 100 exposed to the bottom of the trench 180 to remove the insulating material.

Thereafter, a common source line 230 filling the trench 180 is formed on the insulation spacer 220. For example, a conductive material may be blanket formed on the insulation spacer 220, the substrate 100 exposed to the bottom of the trench 180 and the first interlayer insulation film 170, and the conductive material may be planarized so as to expose the top surface of the first interlayer insulation film 170. The common source line 230 may be electrically connected to the impurity region 102 of the substrate 100 and may extend in the first direction X. The common source line 230 may include may include a metal, metal silicide, or a combination thereof. For example, the common source line 230 may include tungsten, aluminum, copper or metal silicide.

Figure 3M:
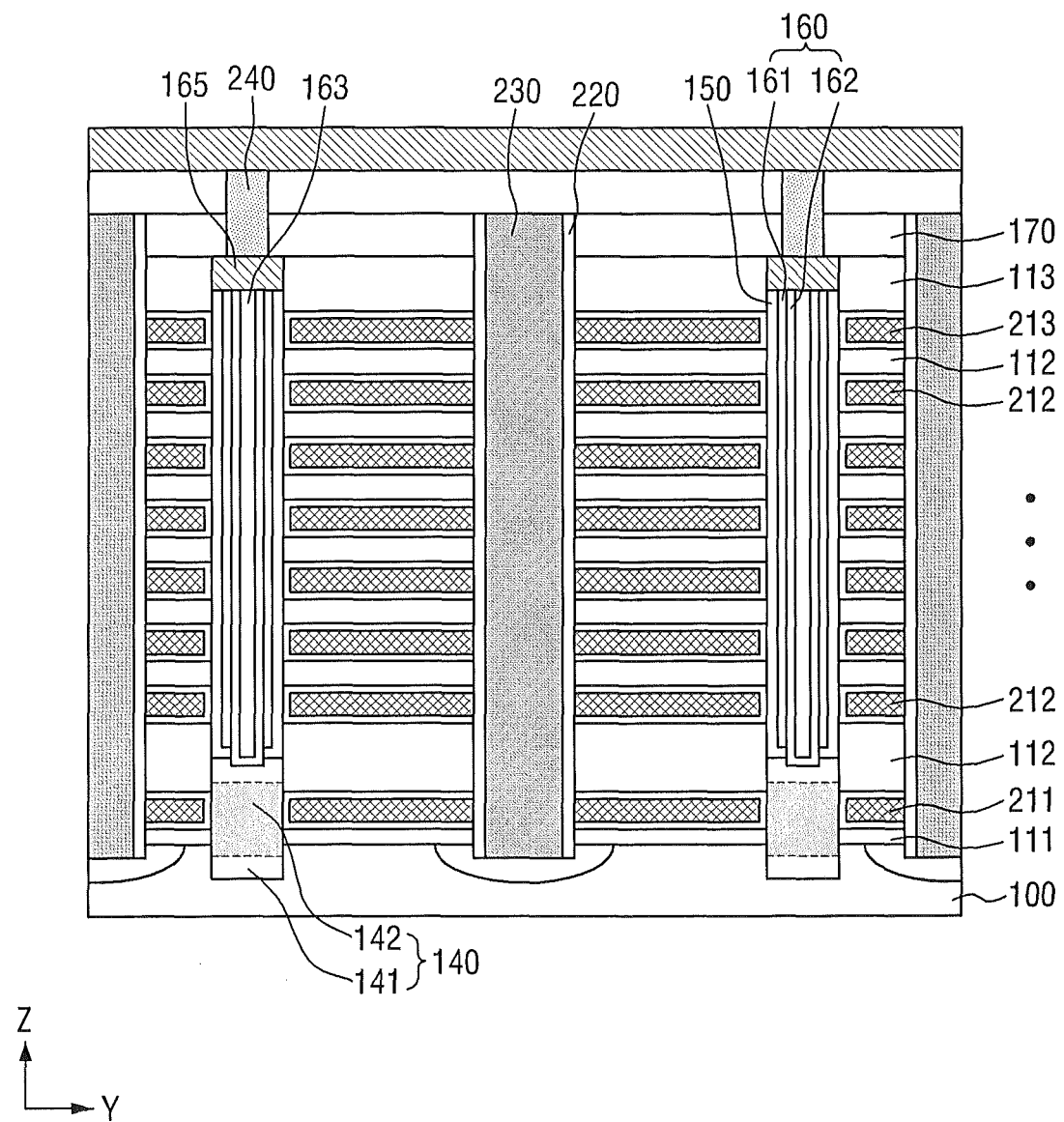

Referring to FIG. 3M, a second interlayer insulation film 175 is formed on the first interlayer insulation film 170, the insulation spacer 220 and the common source line 230, and a bit line contact plug 240 is formed, the bit line contact plug 240 passing through the first interlayer insulation film 170 and the second interlayer insulation film 175 and electrically connected to the channel pad 165.

Thereafter, a bit line 250 connecting the bit line contact plugs 240 may be formed on the second interlayer insulation film 175. The bit line 250 may be shaped of a line extending in the second direction Y.

In the manufacturing method of the 3D semiconductor memory device, the forming of the semiconductor pattern 140 electrically connecting the substrate 100 to the vertical channels 160 and the doping of impurity into the semiconductor pattern 140 are performed in-situ in the same processing equipment, thereby potentially reducing the manufacturing cost of the 3D semiconductor memory device and simplifying processing steps of the manufacturing method of the 3D semiconductor memory device.

Figure 4:
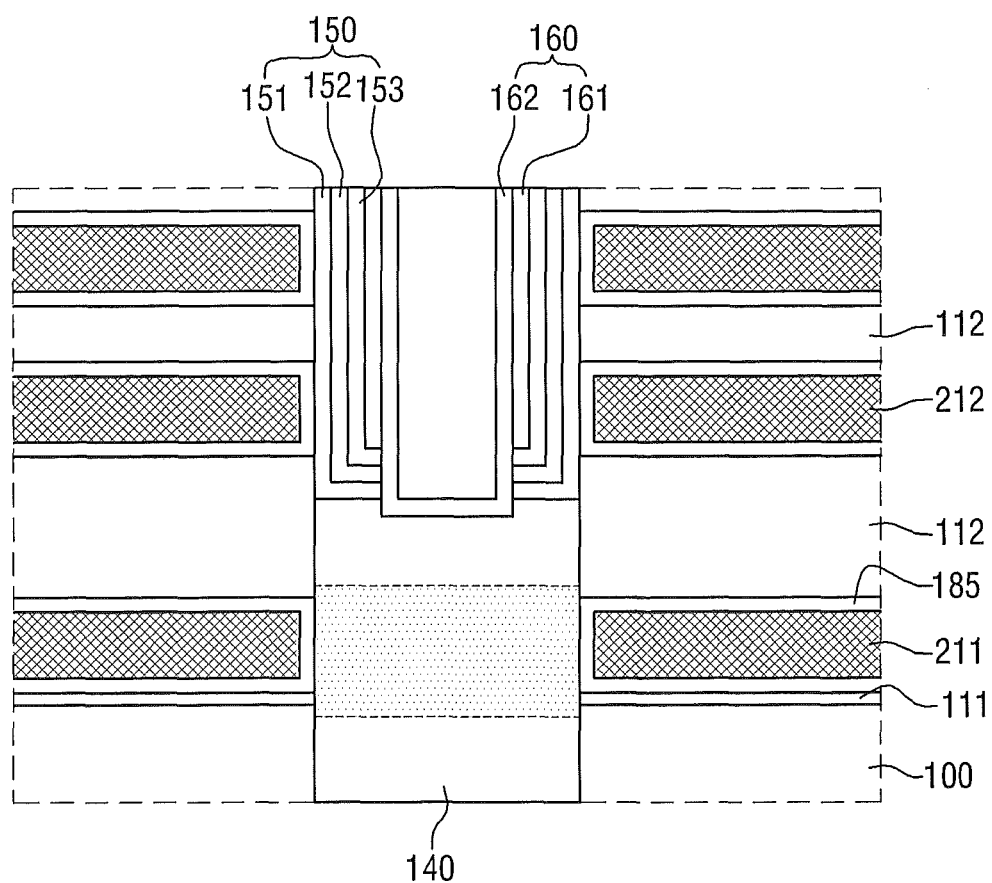
FIG. 4 is an enlarged cross-sectional view of an 'A' portion of FIG. 2.

FIG. 4 is an enlarged cross-sectional view of an 'A' portion of FIG. 2.

Referring to FIG. 4, the vertical channels 160 may be formed in the shape of cylinders extending in the third direction Z. The intermediate insulation films 112 and the cell gate electrodes 212 may be alternatingly stacked in the third direction Z. The vertical channel 160 may include the first semiconductor film 161 and the second semiconductor film 162.

The charge storage film 150 may be positioned between the vertical channels 160, the intermediate insulation films 112 and the plurality of cell gate electrodes 212. The charge storage film 150 may surround outer walls of the vertical channels 160.

The charge storage film 150 may include a tunnel insulation film 153, a charge trap film 152 and a blocking insulation film 151 that are stacked sequentially from the vertical channels 160 to the cell gate electrodes 212. The blocking insulation film 151 formed on the outermost surface of the charge storage film 150 may come into contact with the horizontal insulation film 185.

The tunnel insulation film 153 may include silicon oxide. The charge trap film 152 may include a charge trap layer made of, for example, silicon nitride. The charge trap film 152 may include an insulating layer having quantum dots or nanocrystalline materials. The blocking insulation film 151 may include silicon oxide or metal oxide.

Figure 5A:
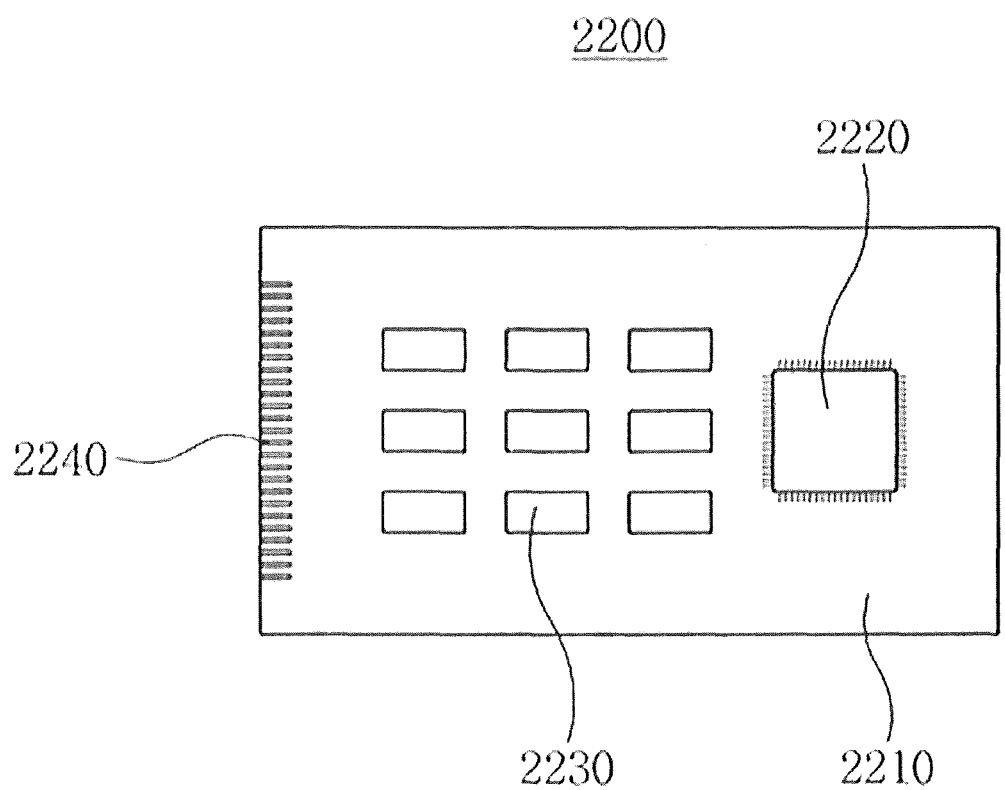
FIG. 5A is a conceptual diagram illustrating a semiconductor module according to an embodiment of the inventive concept.

FIG. 5A is a conceptual diagram illustrating a semiconductor module (2200) according to an embodiment of the inventive concept.

Referring to FIG. 5A, a semiconductor module 2200 may include a processor 2220 and semiconductor devices 2230 mounted on a module substrate 2210. The processor 2220 or the semiconductor devices 2230 may include a semiconductor device 1000 according to various embodiments of the inventive concept. Input/output terminals 2240 may be arranged along at least one side of the module substrate 2210.

Figure 5B:
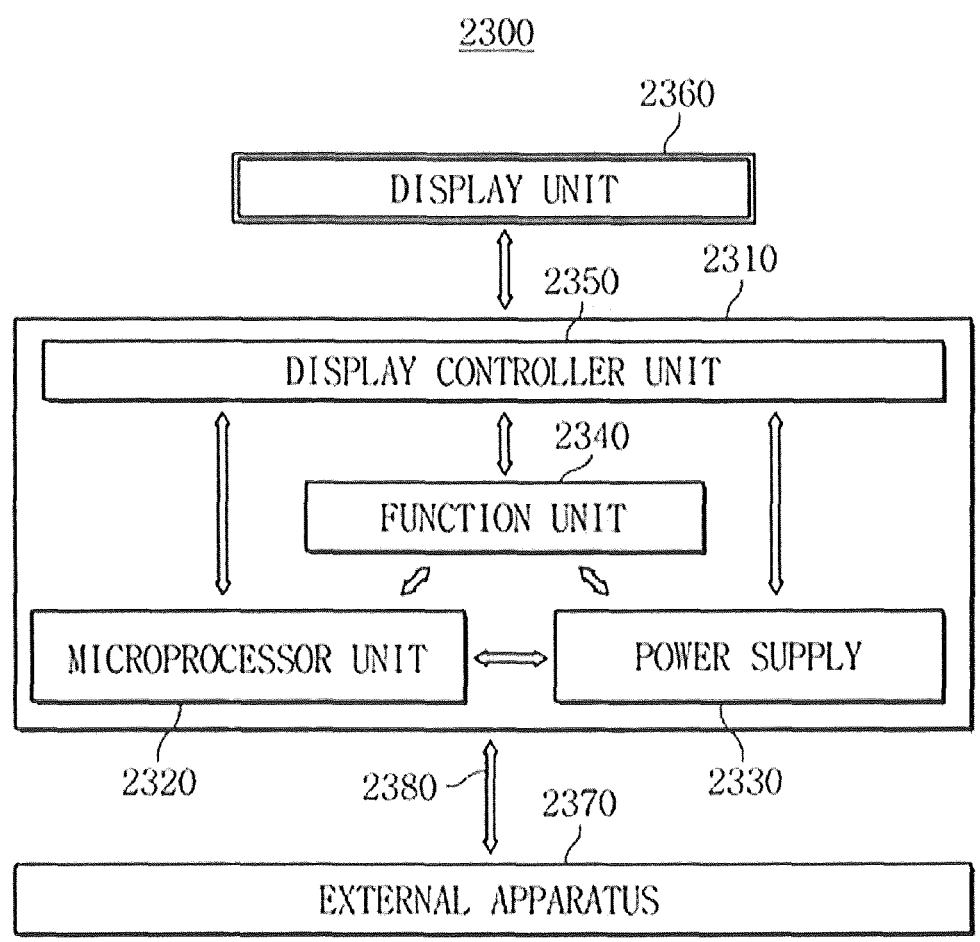
FIGS. 5B and 5C are conceptual block diagrams of electronic systems according to embodiments of the inventive concept.
Figure 5C:
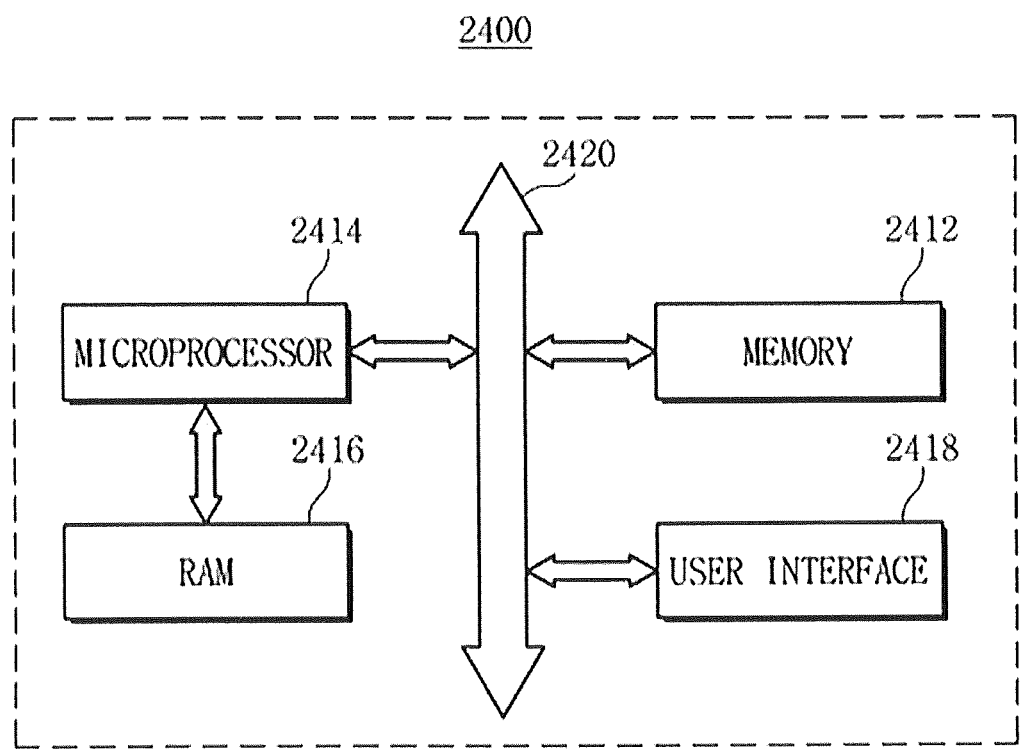

FIGS. 5B and 5C are conceptual block diagrams of electronic systems (2300, 2400) according to embodiments of the inventive concept.

Referring to FIG. 5B, the electronic system 2300 according to an embodiment of the inventive concept may include a body 2310, a display unit 2360, and an external device 2370.

The body 2310 may include a micro processor unit 2320, a power supply 2330, a function unit 2340, and/or a display control unit 2350. The body 2310 may include a system board or a mother board having a printed circuit board (PCB), and/or a case. The micro processor unit 2320, the power supply 2330, the function unit 2340, and the display control unit 2350 may be mounted on a top surface of or disposed in the body 2310. The display unit 2360 may be disposed on the top surface of the body 2310 or inside/outside the body 2310.

The display unit 2360 may display an image processed by the display control unit 2350. For example, the display unit 2360 may be a liquid crystal display (LCD), an active matrix organic light emitting diode (AMOLED), or other types of display panels. The display unit 2360 may include a touch screen. Therefore, the display unit 2360 may have input/output functions.

The power supply 2330 may supply a current or a voltage to the micro processor unit 2320, the function unit 2340, the display control unit 2350, and so on. The power supply 2330 may include a charge battery, a socket for a battery, or a voltage/current converter.

The micro processor unit 2320 may be supplied with a voltage from the power supply 2330 and may control the function unit 2340 and the display unit 2360. For example, the micro processor unit 2320 may include a central processing unit (CPU) or an application processor (AP).

The function unit 2340 may perform various functions of the electronic system 2300. For example, the function unit 2340 may include a touch pad, a touch screen, a volatile/nonvolatile memory, a memory card controller, a camera, a light, an audio and motion picture playback processor, a wireless transceiving antenna, a speaker, a mike, an USB port, or other units of various functions.

The micro processor unit 2320 or the function unit 2340 may include the semiconductor device 1000 according to an exemplary embodiment of the inventive concept.

Referring to FIG. 5C, the electronic system 2400 according to an embodiment of the inventive concept may include a microprocessor 2414 performing data communication through a bus 2420, a memory 2412 and a user interface 2418. The microprocessor 2414 may include a CPU or an AP. The electronic system 2400 may further include a random access memory (RAM) 2416 directly communicating with the microprocessor 2414. The microprocessor 2414 and/or the RAM 2416 may be assembled in a single package. The user interface 2418 may be used in inputting information to the electronic system 2400 or in outputting information from the electronic system 2400. For example, the user interface 2418 may include a touch pad, a touch screen, a keyboard, a mouse, a scanner, a voice detector, a cathode ray tube (CRT) monitor, an LCD, an AMOLED, a plasma display panel (PDP), a printer, a light, or other various types of input/output devices. The memory 2412 may store codes for operation of the microprocessor 2414, data processed by the microprocessor 2414, or externally input data. The memory 2412 may include a memory controller, a hard disk, or a solid state drive (SSD). The microprocessor 2414, the RAM 2416, and/or the memory 2412 may include the semiconductor device 1000 according to the embodiment of the inventive concept.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A method of forming a three dimensional semiconductor memory device, the method comprising:
stacking a first insulation film, a first sacrificial film, alternating second insulation films and second sacrificial films, a third sacrificial film and a third insulation film on a substrate;
forming a channel hole through the first insulation film, the first sacrificial film, the second insulation films, the second sacrificial films, the third sacrificial film and the third insulation film, the channel hole exposing a portion of the substrate; and
forming a semiconductor pattern on the portion of the substrate exposed in the channel hole,
wherein forming the semiconductor pattern comprises forming a lower epitaxial film on the substrate, doping an impurity into the lower epitaxial film, and forming an upper epitaxial film on the lower epitaxial film,
wherein forming the lower epitaxial film, doping of impurity into the lower epitaxial film and forming of the upper epitaxial film are performed in-situ, and
wherein the semiconductor pattern includes a doped region and an undoped region.

2. The method of claim 1, wherein the channel hole extends into the substrate by a first depth, and wherein a thickness of the lower epitaxial film is about equal to the first depth.

3. The method of claim 2, further comprising doping the upper epitaxial film while the upper epitaxial film is being formed.

4. The method of claim 1, further comprising forming a vertical channel on sidewalls of the channel hole.

5. The method of claim 4, wherein a bottom surface of the vertical channel makes contact with the undoped region of the semiconductor pattern.

6. The method of claim 1, wherein a lateral surface of the lower sacrificial film exposed on the sidewalls of the channel hole and the doped region of the semiconductor pattern overlap each other.

7. The method of claim 1, wherein the undoped region of the semiconductor pattern is formed between a bottom surface of the vertical channel and the doped region of the semiconductor pattern.

8. The method of claim 1, wherein doping the impurity into the lower epitaxial film is performed by a gas phase doping process.

9. The method of claim 4, further comprising forming a trench exposing the substrate, wherein the trench passes passing through the first insulation film, the first sacrificial film, the second insulation films, the second sacrificial films, the third sacrificial film and the third insulation film.

10. The method of claim 9, further comprising;
forming an insulation spacer on inner walls of the trench;
forming an impurity region in the exposed portion of the substrate; and
forming a common source line in the trench and making contact with the impurity region.

11. The method of claim 10, further comprising;
forming a fourth insulation film on the common source line, the insulation spacer and the vertical channel;

forming a bit line contact plug electrically connected to the vertical channel while passing through the fourth insulation film; and forming a bit line on the fourth insulation film and the bit line contact plug.

12. The method of claim 4, further comprising forming a charge storage layer on the sidewalls of the channel hole before forming the vertical channel.

13. The method of claim 12, wherein forming the charge storage layer comprises forming a blocking insulation film, charge trap film and a tunnel insulation film on the sidewails of the channel hole.

14. The method of claim 1, further comprising:
removing the first sacrificial film, the second sacrificial films and the third sacrificial film; and
forming a ground select gate electrode, cell gate electrodes and a string gate electrode in regions from which the first sacrificial film, the second sacrificial films and the third sacrificial film are removed.

15. A method of forming a three dimensional semiconductor memory device, the method comprising:
stacking a first insulation film, a first sacrificial film, alternating second insulation films and second sacrificial films, a third sacrificial film and a third insulation film on a substrate;
forming a channel hole that exposes a portion of the substrate, wherein the channel hole passes through the first insulation film, the first sacrificial film, the second insulation films, the second sacrificial films, the third sacrificial film and the third insulation film; and
doping an impurity into a semiconductor pattern while forming the semiconductor pattern on the portion of the substrate exposed in the channel hole by selective epitaxial growth,
wherein the semiconductor pattern includes a doped region and an undoped region.

16. The method of claim 15, wherein the undoped region comprises a first undoped region on the doped region and the substrate, and wherein the method further includes forming a second undoped region between the substrate and the doped region.

17. The method of claim 15, wherein forming the semiconductor pattern comprises forming a lower epitaxial film on the exposed portion of the substrate and forming an upper epitaxial film on the lower epitaxial film.

18. The method of claim 17, further comprising doping the lower epitaxial film by gas phase doping after forming the lower epitaxial film.

19. The method of claim 18, further comprising doping a portion of the upper epitaxial film during growth of the upper epitaxial film.

20. A method of forming a three dimensional semiconductor memory device, the method comprising:
forming an alternating stack of insulation films and sacrificial films on a substrate;
forming a channel hole through the alternating stack of insulation films and sacrificial films, the channel hole exposing a portion of the substrate and extending into the substrate; and
forming a semiconductor pattern on the portion of the substrate exposed in the channel hole,
wherein the semiconductor pattern includes a first undoped region on the substrate, a doped region on the first undoped region, and a second undoped region on the doped region opposite the first undoped region.

* * * * *